(12) United States Patent
Jones et al.

(10) Patent No.: US 12,155,170 B2
(45) Date of Patent: *Nov. 26, 2024

(54) CRI-BOOSTER WHITE LASER FIBER SOURCE

(71) Applicant: Fraen Corporation, Reading, MA (US)

(72) Inventors: Carlton S. Jones, Boxford, MA (US); Renald Dore, Somerville, MA (US)

(73) Assignee: Fraen Corporation, Reading, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/233,604

(22) Filed: Aug. 14, 2023

(65) Prior Publication Data

US 2023/0387649 A1    Nov. 30, 2023

Related U.S. Application Data

(63) Continuation of application No. 17/578,121, filed on Jan. 18, 2022, now Pat. No. 11,728,615, which is a
(Continued)

(51) Int. Cl.
*H01S 3/30* (2006.01)
*H01S 3/067* (2006.01)
*H01S 3/08* (2023.01)
*H01S 5/00* (2006.01)
*H01S 5/183* (2006.01)
*H01S 5/02251* (2021.01)
*H01S 5/024* (2006.01)
*H01S 5/40* (2006.01)

(52) U.S. Cl.
CPC ............ *H01S 5/0087* (2021.01); *H01S 3/067* (2013.01); *H01S 3/08086* (2013.01); *H01S 5/005* (2013.01); *H01S 5/18397* (2013.01); *H01S 5/02251* (2021.01); *H01S 5/02415* (2013.01); *H01S 5/4012* (2013.01)

(58) Field of Classification Search
CPC .... H01S 5/0087; H01S 3/067; H01S 3/08086; H01S 5/005; H01S 5/18397; H01S 5/02251; H01S 5/02415; H01S 5/4012
See application file for complete search history.

(56) References Cited

U.S. PATENT DOCUMENTS 9,611,987 B2 * 4/2017 Kelchner .................. F21K 9/64
11,228,157 B2 * 1/2022 Jones ..................... H01S 5/0087
(Continued)

FOREIGN PATENT DOCUMENTS

WO          0035402 A1     6/2000

OTHER PUBLICATIONS

International Preliminary Report on Patentability, PCT/US2020/034570, dated Dec. 2, 2021, 7 Pages.
(Continued)

*Primary Examiner* — Kinam Park
(74) *Attorney, Agent, or Firm* — Potomac Law Group, LLC; Reza Mollaaghababa; Reza Sadr

(57) ABSTRACT

In one aspect, an optical system for delivering light into an optical fiber is disclosed, which comprises a phosphor-converted white light source for generating white light, a red light emitting diode (LED) for generating red light, and a light-delivery system for delivering at least a portion of said white light and said red light into an input port of an optical fiber.

13 Claims, 3 Drawing Sheets

Related U.S. Application Data continuation of application No. 16/883,847, filed on May 26, 2020, now Pat. No. 11,228,157.

(60) Provisional application No. 62/852,855, filed on May 24, 2019.

(56) References Cited

U.S. PATENT DOCUMENTS

| | | | |
|---|---|---|---|
| 2006/0227302 A1 | 10/2006 | Harbers et al. | |
| 2009/0306478 A1* | 12/2009 | Mizuyoshi | A61B 1/07 600/178 |
| 2011/0292343 A1* | 12/2011 | Papac | G02B 27/145 351/221 |
| 2012/0147332 A1* | 6/2012 | Huang | G03B 21/2066 362/583 |
| 2014/0126200 A1* | 5/2014 | Kelchner | F21K 9/64 362/230 |
| 2015/0374217 A1* | 12/2015 | Sinofsky | F21K 2/00 600/177 |
| 2018/0216002 A1* | 8/2018 | Nagao | C09K 11/77747 |
| 2019/0072241 A1* | 3/2019 | Ito | A61B 1/0638 |
| 2023/0387649 A1* | 11/2023 | Jones | G02B 6/4204 |

OTHER PUBLICATIONS

International Search Report and Written Opinion, PCT/US2020/034570, dated Aug. 28, 2020, 11 pages.

\* cited by examiner

CRI-BOOSTER WHITE LASER FIBER SOURCE

RELATED APPLICATIONS

The present application is a continuation application of U.S. application Ser. No. 17/578,121, filed on Jan. 18, 2022, entitled "CRI-BOOSTER WHITE LASER FIBER SOURCE", to be issued as U.S. Pat. No. 11,728,615 on Aug. 15, 2023, which is a continuation of U.S. patent application Ser. No. 16/883,847, now issued as U.S. Pat. No. 11,228,157, filed on May 26, 2020, which claims priority to U.S. Provisional patent application No. 62/852,855, filed on May 24, 2019, the teachings of which is incorporated herein by reference in its entirety.

FIELD

The present invention relates generally to methods and systems for delivering light into an optical fiber, and more particularly, to such methods and systems that enhance the color-rendering-index (CRI) and the color temperature of light coupled via a phosphor-converted laser white light source into the optical fiber.

BACKGROUND

A phosphor-converted laser white light source is particularly suited for coupling light into small-diameter fiber optics (e.g., fiber optics having a diameter of 2 mm or less) because of the small size of the light-emitting phosphor (e.g., about 3 mm) and the high luminous flux generated by such a light source. For example, such a phosphor-converted laser white light source can emit white light with a luminous flux of about 400 lumens, which corresponds to a lumens density of 4000 lm/mm$^2$ for a diameter of about 0.3 mm for the emitting surface, and is roughly ten times the lumen density of the brightest white LEDs.

Notwithstanding their advantages, phosphor-converted laser white light sources can have a number of shortcomings. For example, such light sources can produce lower color-rendering-index (CRI) than white LEDs (e.g., in a range of about 60-65 CRI), and they inherently produce much lower lumens/watt than white LEDs.

For some applications (e.g., CCT cameras, certain surgical instruments, such as endoscopes), the required CRI is about 80 or higher, and the required color temperature is 5000° K or lower. Increasing the CRI of a phosphor-converted white laser source by using more or different phosphor can decrease its already low lumens/watt. Further, filtering the white light can decrease significantly the efficiency of the light source.

SUMMARY

Optical systems and methods for improving CRI and color temperature of phosphor-converted laser white light sources are disclosed. In one aspect, an optical system for delivering light into an optical fiber is disclosed, which comprises a phosphor-converted white light source for generating white light, a red light emitting diode (LED) for generating red light, and a light-delivery system for delivering at least a portion of said white light and said red light into an input port of an optical fiber.

The light-delivery system can include one or more lenses for focusing the white light emitted by the laser-driven phosphor-converted white light source into an input port (e.g., an input surface) of the optical fiber.

The light-delivery system can further include an elliptical reflector that is optically coupled to the red LED for directing at least a portion of the red light emitted by the red LED, via an elliptical reflecting surface thereof, into the input port of the optical fiber. In some embodiments, the elliptical reflector can be positioned such that one focus thereof is in proximity of the red LED and a conjugate focus thereof is positioned in proximity of the input port of the optical fiber.

Additionally or alternatively, the elliptical reflecting surface can surround the one or more lenses. Further, in some embodiments, the elliptical reflecting surface can include features, e.g., brackets, for mounting the one or more lenses and aligning those lenses with the white light source and the input of the optical fiber.

The light-delivery system can further include a light pipe that is optically coupled at a proximal end thereof to the red LED for receiving light therefrom and is optically coupled at a distal end thereof to the one or more lenses such that the red light exiting the light pipe is directed by those lenses to the input port of the optical fiber.

In some embodiments, the red LED can be positioned relative to the one or more lenses such that the light emitted thereby propagates directly to those lenses along a portion of the path of the white light to be focused by those lenses into the input port of the optical fiber. Further, the LED can be thermally coupled to a heat sink, and configured to facilitate the removal of heat generated by the LED. By way of example, the heat sink can include fins for enhancing the surface area of the heat sink for transferring heat from the LED to the surrounding environment.

In some embodiments, the laser-driven phosphor-converted white light source can generate light with a luminous flux in a range of about 100 to about 400 lumens. Additionally or alternatively, the red LED can generate light with a luminous flux in a range of about 50 to about 400 lumens.

Further, the input port of the optical fiber can have a diameter in a range of equal to or less than about 2 mm, e.g., in a range of about 0.1 mm to about 2 mm, e.g., in a range of about mm to about 0.5 mm.

The introduction of the red light, together with the white light, into the optical fiber can advantageously improve the color-rendering-index (CRI) and the color temperature of the light outputted by the optical fiber. By way of example, in some embodiments, the CRI of the light outputted by the optical fiber can be at least about 80, e.g., in a range of about 80 to about 100, and the respective color temperature of the outputted light can be, for example, equal to or less than about 5000° K, e.g., less than about 3000° K.

In a related aspect, a method of delivering light into an optical fiber is disclosed, which includes directing white light generated by a laser-driven phosphor-converted white light source into an optical fiber via an input port thereof, where the optical fiber includes an output port through which light exits the fiber. The method further includes directing red light generated by a red LED into the input port of the optical fiber such that the light exiting the optical fiber would exhibit a CRI of at least about 80. In some embodiments, the light exiting the output port of the optical fiber exhibits a color temperature equal to or less than about 5000° K.

Further understanding of various aspects of the invention can be obtained with reference to the following detailed description in conjunction with the associated drawings, which are described briefly below.

DETAILED DESCRIPTION

Figure 1:
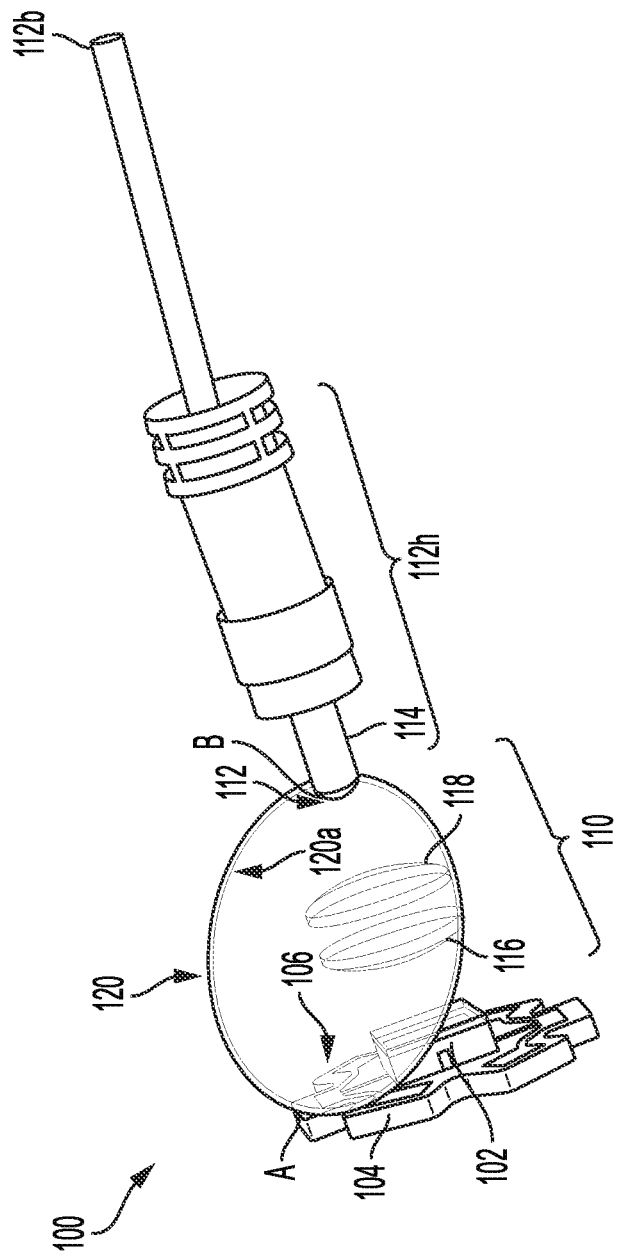
FIG. 1 schematically depicts an optical system according to some embodiments of the present teachings, which introduces white light generated by a laser-driven phosphor-converted white light source and red light generated by an LED into an optical fiber, FIG. 2 schematically depicts another optical system according to some embodiments of the present teachings, and FIG. 3 schematically depicts yet another optical system according to some embodiments of the present teachings.

FIG. 1 schematically depicts an optical system 100 according to an embodiment of the invention, which includes a laser-driven phosphor-converted white light source 102 for generating white light. The light 102 is mounted on a printed circuit board (PCB) 104, which can in some cases include a heat sink for removing heat from the light source. The optical system 100 further includes a red light emitting diode (LED) 106 that generates red light, e.g., at a wavelength of about 635 nm. In this embodiment, the red LED 106 is mounted on the PCB 104, but in other embodiments, it can be mounted on a separate PCB.

The optical system 100 can further include a light-delivery system 110 for delivering the light emitted by the white light source 102 and the red LED 106 into an input port 112a of an optical fiber 114. The optical system 100 can further including a housing 112h having a lumen, in which the optical fiber 114 can be disposed. The light inputted into the optical fiber 114 propagates through the fiber and exits the fiber via an output port 112b thereof. In this embodiment, the light-delivery system 110 includes a pair of convergent lenses 116/118 for focusing the light generated by the white light source 102 into the optical fiber 114. In some embodiments, the convergent lenses 116/118 are configured and positioned relative to the white light source to image the emitting surface of the white light source onto the input port of the optical fiber. In some embodiments, each of the lenses 116/118 can have an optical power in a range of about 10 to about 100 Diopters, though other optical powers can also be employed.

The light-delivery system 110 further includes an elliptical reflector 120 having an elliptical reflective surface 120a, which is optically coupled to the red LED 106 to transfer the red light emitted by the red LED 106 into the optical fiber 114. Specifically, the elliptical surface of the elliptical reflector 120 can be positioned such that the red LED is located in proximity of one focal point (A) of the elliptical surface 120a, e.g., within about 5 millimeters of the focal point, and the input port (herein also referred to as the input surface) of the optical fiber 114 is located in proximity of the conjugate focal point (B) of the elliptical surface, e.g., within about 5 millimeters of that focal point. In this manner, the elliptical reflector efficiently transfers the light emitted by the red LED into the input port 112a of the optical fiber 114.

With continued reference to FIG. 1, the pair of convergent lenses 116/118 can be disposed within the elliptical reflector 120. In some embodiments, the elliptical reflector 120 can be formed of high reflectivity white plastic. By way of example, in some embodiments, the elliptical reflector 120 can be molded into two halves and can incorporate features (mounting elements) to mount the two convergent lenses 116/118 as well as to align the lenses with the white light source and the input of the fiber optic.

Although the two lenses 116/118 can interfere with the passage of the light emitted by the red LED into the optical fiber, nonetheless, the elliptical reflector can direct a significant portion of the red light into the optical fiber.

In some embodiments, the input surface of the optical fiber 114 can have a diameter less than about 3 mm, e.g., in a range of about 1 mm to about 2 mm.

The introduction of the red LED light together with the white light into the optical fiber can advantageously enhance color-rendering-index (CRI) of the output light of the fiber (i.e., the light exiting the optical fiber). For example, the CRI of the fiber output light can be at least about 80, e.g., in a range of about 80 to about 100. Further, the color temperature of the output light of the fiber can be 5000° K or lower, e.g., less than about 3000° K. Such enhanced color-index-rendering and/or color temperature can be advantageous in a variety of applications, such as CCT cameras, and certain surgical instruments (e.g., endoscopes). The introduction of red light from a red LED into the fiber can significantly boost CRI as well as red rendering (R9) while having little effect on lumens efficiency of the system.

Figure 2:
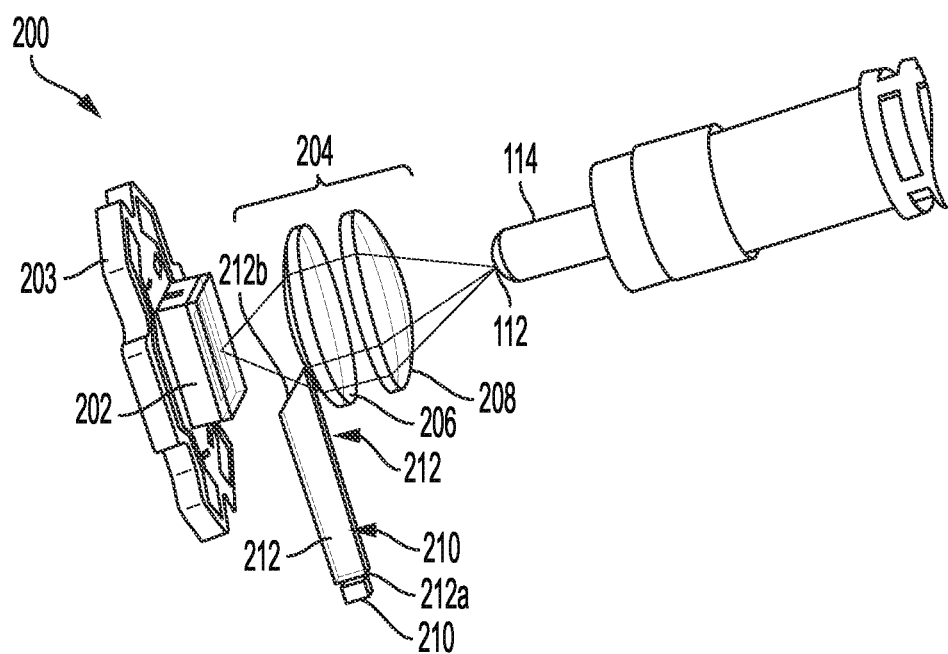

FIG. 2 schematically illustrates another embodiment of an optical system 200 according to the present teachings. As described with reference to optical system 100 illustrated in FIG. 1, the optical system 200 can include a laser-driven phosphor-converted white light source 202 mounted on a PCB 204, which generates white light. Similarly, light-delivery system 204, which includes two convergent lenses 206/208, can be configured direct the light emitted by the white light source 202 into the input port 112 of the optical fiber 114.

The optical system 200 can further include a red LED 210 and a light pipe 212 that is optically coupled to the red LED 210 at an input surface 212a thereof for receiving the light emitted by the LED. The light from the red LED that is introduced into the light pipe propagates through the light pipe to reach a slanted reflective surface 212b that is disposed at the distal end of the light pipe. Some of the light introduced into the light pipe is reflected at side walls thereof, e.g., via total internal reflection, to reach the slanted surface 212b, and some of the light reaches the slanted surface 212b directly, i.e., without undergoing reflections at the light pipe's sidewalls. The reflective surface 212b reflects the light incident thereon and the reflected light exits the light pipe via a side wall thereof in a direction toward the convergent lenses 206/208, which in turn focus the light onto the input surface 112 of the optical fiber 114.

In some embodiments, the reflective surface 212b can reflect the light incident thereon via total internal reflection, and in some other embodiments, the reflective surface 212b is metalized so as to reflect the light incident thereon.

The light pipe 212 can be implemented in a variety of different ways. For example, in some embodiments, the light pipe 212 can have a polygonal cross-sectional profile, e.g., hexagonal, or octagonal, though other cross-sectional profiles can also be employed.

In some embodiments, the length of the light pipe can be, for example, in a range of about 5 mm to about 50 mm.

Figure 3:
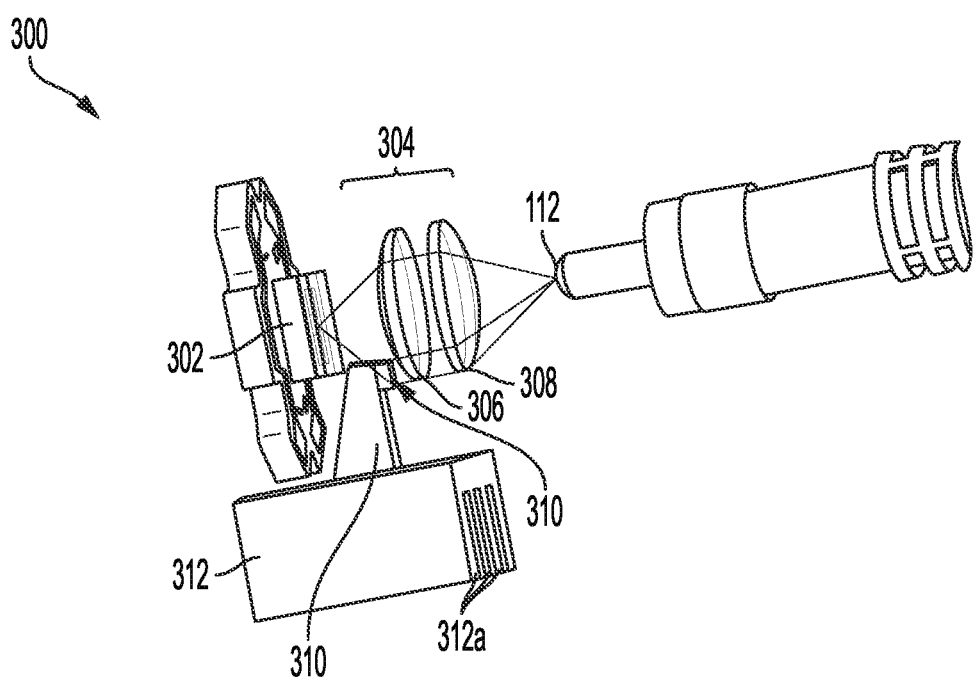

FIG. 3 schematically illustrates an optical system 300 according to another embodiment, which includes a laser-driven phosphor-converted white light source 302 for generating white light. Similar to the previous embodiments, the white light source 302 can be mounted on a PCB, and optionally onto a heat sink. Again, similar to the previous embodiment, a light-delivery system 304 composed of two convergent lenses 306/308 direct the light generated by the white light source 302 to the input port 112 of the optical fiber 114.

In this embodiment, a red LED 310 can be positioned such that the light emitted thereby is directly received by the light-delivery system 304 and is directed thereby onto the input port 112 of the optical fiber 114 without obstructing the optical path of the white light propagating from the laser-driven phosphor-converted white light source.

Further, the red LED 310 can be thermally coupled to a heat sink 312, which can facilitate the dissipation of the heat generated by the LED. The heat sink can include a plurality of fins 312a for enhancing the surface area of the heat sink for more efficient heat dissipation.

Those having ordinary skill in the art will appreciate that various changes can be made to the above embodiments without departing from the scope of the invention.

What is claimed is:

1. An optical system, comprising:
   a first light source,
   a second light source,
   an optical fiber extending from an input port to an output port,
   a pair of convergent lenses for focusing light emitted by the first light source into the optical fiber, and
   an elliptical reflector having an elliptical reflecting surface that is optically coupled to the second light source to transfer light emitted by the second light source into the optical fiber.

2. The optical system of claim 1, wherein the first light source comprises a laser-driven phosphor-converted white light source configured to generate white light.

3. The optical system of claim 1, wherein the second light source comprises a red light emitting diode (LED) configured to generate red light.

4. The optical system of claim 1, further comprising a heat sink thermally coupled to the second light source.

5. The optical system of claim 1, wherein a focus of the elliptical reflector is in proximity of the second light source and a conjugate focus of the elliptical reflector is positioned in proximity of the input port of the optical fiber such that the elliptical reflecting surface transfers the light from the second light source to the optical fiber.

6. The optical system of claim 1, wherein the elliptical reflecting surface surrounds the pair of convergent lenses.

7. The optical system of claim 1, further comprising a light pipe, wherein:
   the light pipe is optically coupled at a proximal end to the second light source and configured to receive light from the second light source; and
   the light pipe is optically coupled at a distal end to the pair of convergent lenses and configured to direct, by the pair of convergent lenses, the light exiting the light pipe into the input port of the light pipe.

8. The optical system of claim 1, wherein the second light source is positioned relative to the pair of convergent lenses such that the light emitted by the second light source propagates directly to the pair of convergent lenses along a portion of a light path of light exiting the first light source.

9. The optical system of claim 1, wherein the first light source generates light with a luminous flux in a range of about 100 to about 400 lumens.

10. The optical system of claim 9, wherein the second light source generates light with a luminous flux in a range of about 200 to about 300 lumens.

11. The optical system of claim 1, wherein the input port of the optical fiber has a diameter equal to or less than about 2 mm.

12. The optical system of claim 1, wherein light exiting the output port of the optical fiber exhibits a color-rendering-index (CRI) of at least about 80.

13. The optical system of claim 12, wherein the light exiting the output port of the optical fiber exhibits a color temperature equal to or less than about 5000 K.

* * * * *